(12) United States Patent
Chen et al.

(10) Patent No.: US 11,327,108 B2
(45) Date of Patent: May 10, 2022

(54) AUTOMATIC TESTING SYSTEM AND METHOD

(71) Applicant: Wistron Corporation, New Taipei (TW)

(72) Inventors: Hsiang-Yu Chen, New Taipei (TW); Po-Ju Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 65 days.

(21) Appl. No.: 16/883,607

(22) Filed: May 26, 2020

(65) Prior Publication Data
US 2021/0278454 A1 Sep. 9, 2021

(30) Foreign Application Priority Data
Mar. 5, 2020 (TW) .................................. 109107182

(51) Int. Cl.
*G01R 31/28* (2006.01)
(52) U.S. Cl.
CPC ....... *G01R 31/2834* (2013.01); *G01R 31/282* (2013.01); *G01R 31/2825* (2013.01)
(58) Field of Classification Search
CPC .............. G01R 31/2834; G01R 31/282; G01R 31/2825

USPC ..... 324/511, 756.02, 750.16, 750.19, 750.22
See application file for complete search history.

(56) References Cited

U.S. PATENT DOCUMENTS

| 10,656,206 | B1 * | 5/2020 | Patil .................... | G01R 31/2834 |
| 2009/0146359 | A1 * | 6/2009 | Canfield ............ | G01R 31/2891 |
| | | | | 269/289 R |
| 2016/0187877 | A1 * | 6/2016 | Diperna ................ | B25J 9/1679 |
| | | | | 702/108 |
| 2020/0003835 | A1 * | 1/2020 | Ahmad .............. | G01R 31/2849 |

FOREIGN PATENT DOCUMENTS

| CN | 203566537 U | 4/2014 |
| CN | 105116265 A | 12/2015 |
| CN | 106908720 A | 6/2017 |

* cited by examiner

*Primary Examiner* — Tung X Nguyen
*Assistant Examiner* — Robert P Alejnikov, Jr.
(74) *Attorney, Agent, or Firm* — Donald E. Stout; Stout, Uxa & Buyan, LLP

(57) ABSTRACT

An automatic testing system includes a platform; a carrier fixed on a surface of the platform for carrying a device under test (DUT); a function test module for testing functions of the DUT; and a shifting module for shifting the function test module.

19 Claims, 10 Drawing Sheets

AUTOMATIC TESTING SYSTEM AND METHOD

CROSS-REFERENCE TO RELATED APPLICATIONS

This application claims priority to Taiwan Patent Application No. 109107182, filed on Mar. 5, 2020, the entire contents of which are herein expressly incorporated by reference.

BACKGROUND OF THE INVENTION

1. Field of the Invention

The present disclosure generally relates to an automatic testing system, and more particularly to an automatic testing system adaptable to a mobile electronic device.

2. Description of Related Art

A mobile phone is becoming indispensable to modern people. The mobile phone is capable of making voice calls, providing multimedia applications and connecting to the Internet. A touch screen is commonly used as an input-out device for the mobile phone, and a camera is ordinarily set up in the mobile phone to capture a still image or video.

A manufactured mobile phone needs to be tested for a variety of functions before leaving the factory. The mobile phone can be handed to a customer only when the test result meets predetermined requirements. In the present mobile phone industry, mobile phones are tested for functions manually by testing personnel. However, standardization of manual testing could not be easily reached, and therefore some test items are inevitably omitted or misjudgments are unavoidably made. Moreover, cost of employing the testing personnel becomes burdensome due to great amount of manufactured mobile phones or increased or complicated functions of the mobile phones. As new mobile phones are released faster and users replace mobile phones more frequently, the amount of recycled mobile phones is thus increasing. Therefore, demand for testing the mobile phones in the recycled mobile phones market becomes urgent.

A need has thus arisen to propose a novel scheme to standardize the mobile phone testing, reduce cost and speed up testing to shorten test time.

SUMMARY OF THE INVENTION

In view of the foregoing, it is an object of the embodiment of the present disclosure to provide an automatic testing system adaptable to automatically testing mobile electronic devices.

According to one embodiment, the automatic testing system includes a platform, a carrier, a function test module and a shifting module. The carrier is fixed on a surface of the platform for carrying a device under test (DUT). The function test module is used to test a plurality of functions of the DUT. The shifting module is used to shift the function test module.

DETAILED DESCRIPTION OF THE INVENTION

Figure 1A:
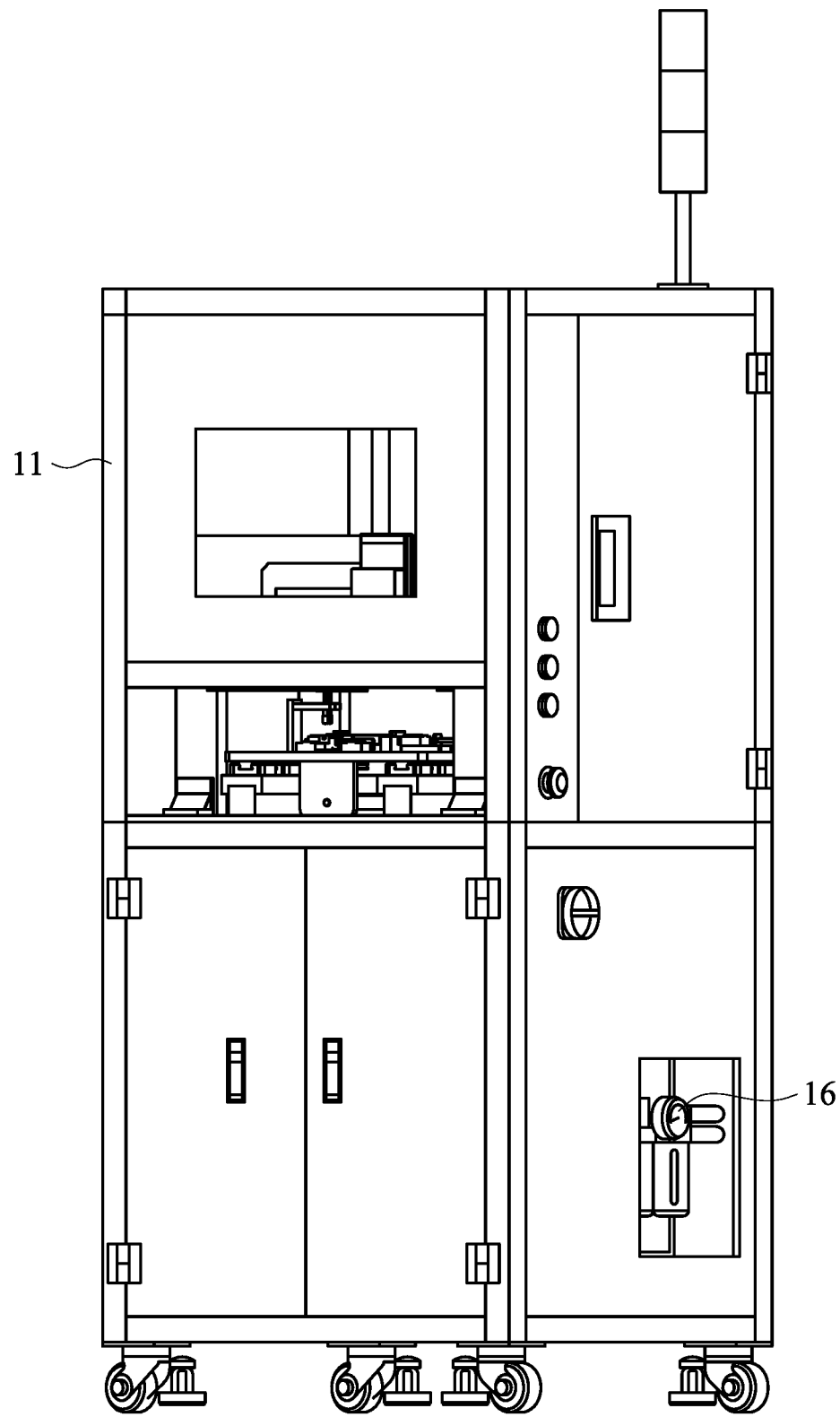
FIG. 1A shows an external perspective view of an automatic testing system according to one embodiment of the present disclosure.
Figure 1B:
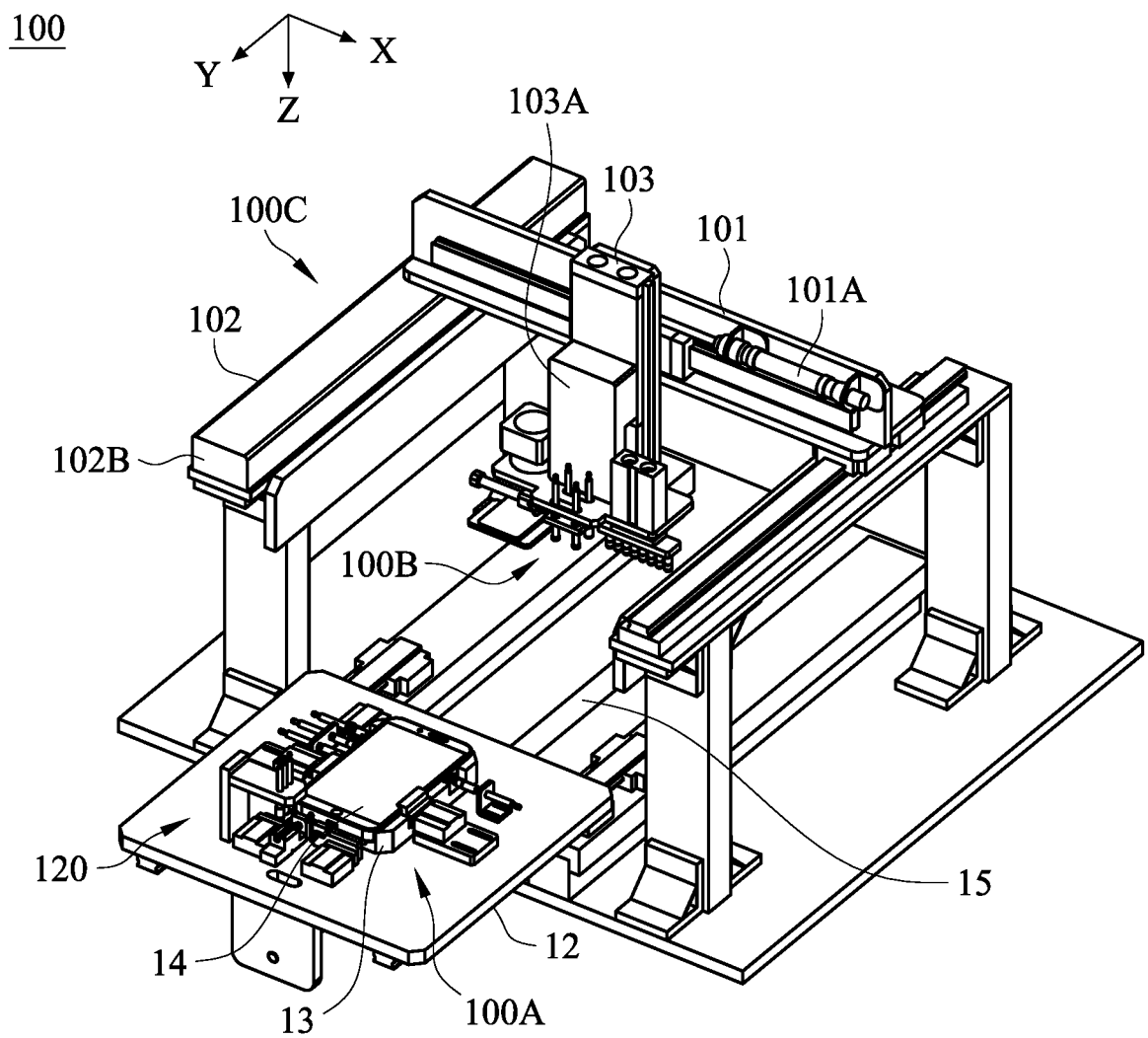
FIG. 1B shows an inner perspective view of the automatic testing system according to the embodiment of the present disclosure.

FIG. 1A shows an external perspective view of an automatic testing system 100 according to one embodiment of the present disclosure, and FIG. 1B shows an inner perspective view of the automatic testing system 100 according to the embodiment of the present disclosure. The automatic testing system 100 of the embodiment may be adaptable to testing a mobile (or portable) electronic device such as mobile phone. As shown in FIG. 1A, the automatic testing system 100 may include a casing 11, which defines a space to accommodate the apparatus as shown in FIG. 1B.

Figure 2:
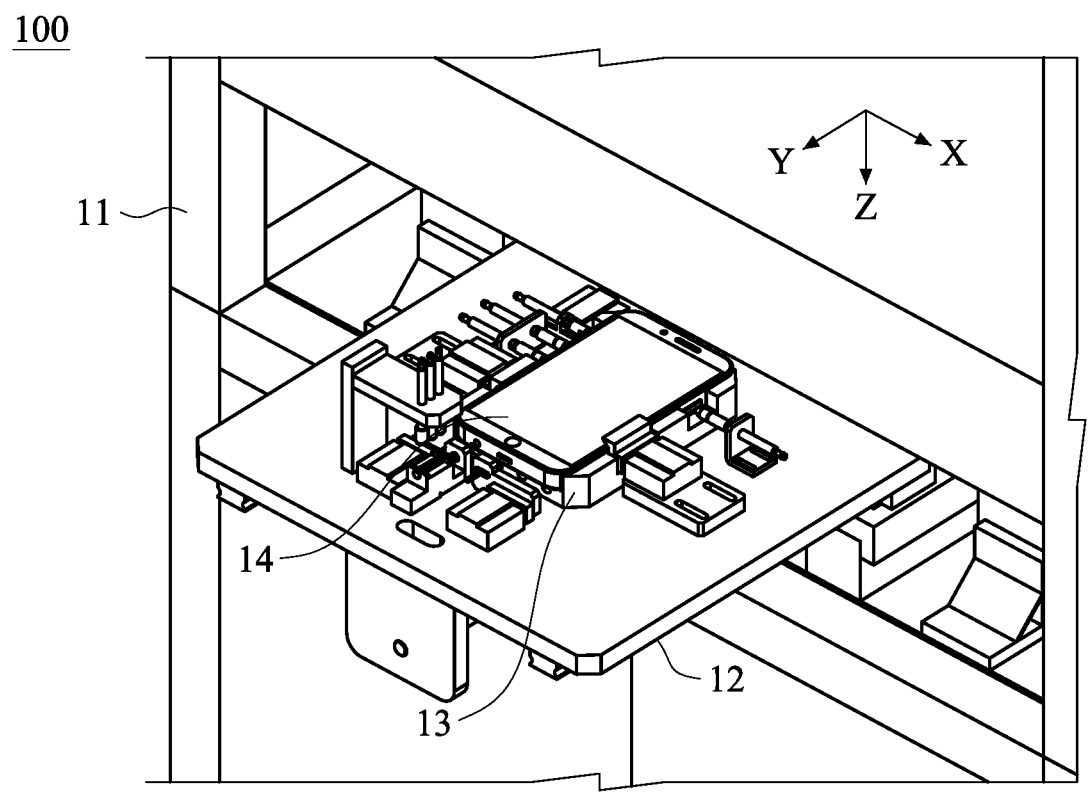
FIG. 2 shows a perspective view of the automatic testing system according to the embodiment of the present disclosure.

In the embodiment, as shown in FIG. 1B, the automatic testing system 100 may include a platform 12 and a carrier 13 fixed on a surface of the platform 12 for carrying a device under test (DUT) 14. The automatic testing system 100 may include a stretching (pneumatic) cylinder 15 connected to the platform 12. The stretching cylinder 15 may push the platform 12 outside the casing 11 (as illustrated in FIG. 2) for placing the DUT 14 in the carrier 13 before performing test. Afterward, the stretching cylinder 15 may pull the platform 12 inside the casing 11 ready for performing test.

Figure 3A:
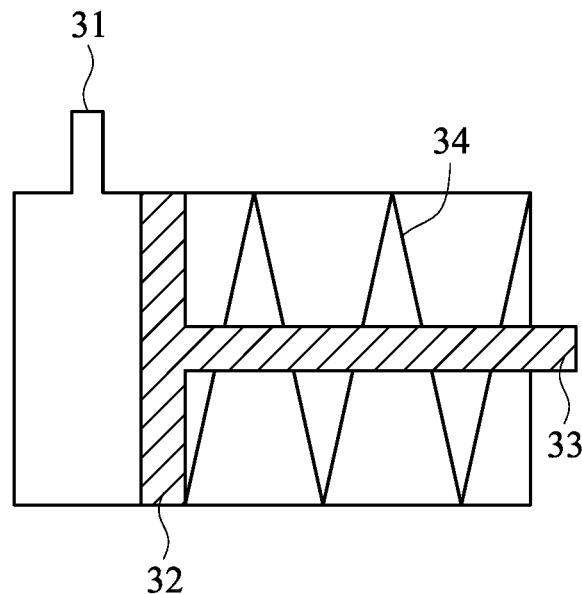
FIG. 3A shows a schematic diagram illustrating a single-acting cylinder.
Figure 3B:
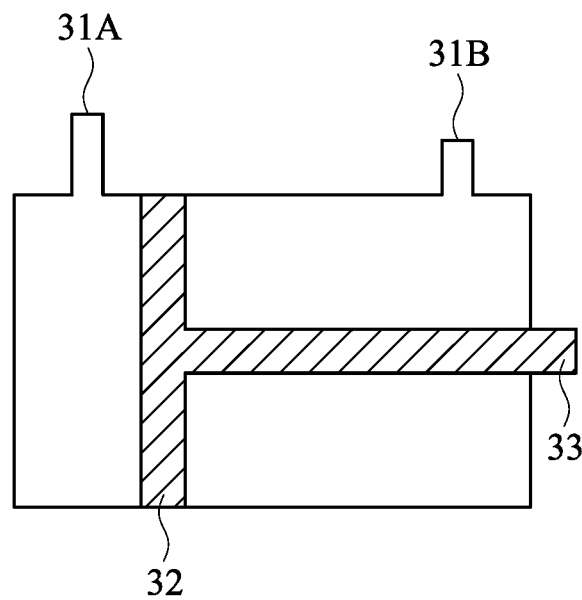
FIG. 3B shows a schematic diagram illustrating a double-acting cylinder.

The stretching cylinder 15 may be a single-acting (pneumatic) cylinder or a double-acting cylinder. FIG. 3A shows a schematic diagram illustrating a single-acting cylinder 300A with a gas inlet 31. Gas injected through the gas inlet 31 may push a piston 32 to move a rod 33 outward; and a spring 34 may force the piston 32 and the rod 33 backward when stopping injecting gas. As shown in FIG. 1A, gas may be provided via a gas source supply port 16. FIG. 3B shows a schematic diagram illustrating a double-acting cylinder 300B with a first gas inlet 31A and a second gas inlet 31B. Gas injected through the first gas inlet 31A may force a piston 32 to move a rod 33 outward; and gas injected instead through the second gas inlet 31B may force the piston 32 and the rod 33 backward. The automatic testing system 100 of the embodiment may include a plurality of cylinders (such as the stretching cylinder 15), which may be single-acting cylinders 300A or double-acting cylinders 300B. Details of the cylinders described in the following paragraphs are omitted for brevity.

In the specification, varieties of cylinders (such as the stretching cylinder 15) of the automatic testing system 100 are shown only for illustrative purposes, and may be generalized to driving devices, which convert a power into a force in a motion. Taking the cylinder as an example, the cylinder uses the power of compressed gas to produce a force in a linear or rotary motion. In addition to the cylinders, the driving devices may include other devices such as step motors.

Figure 4A:
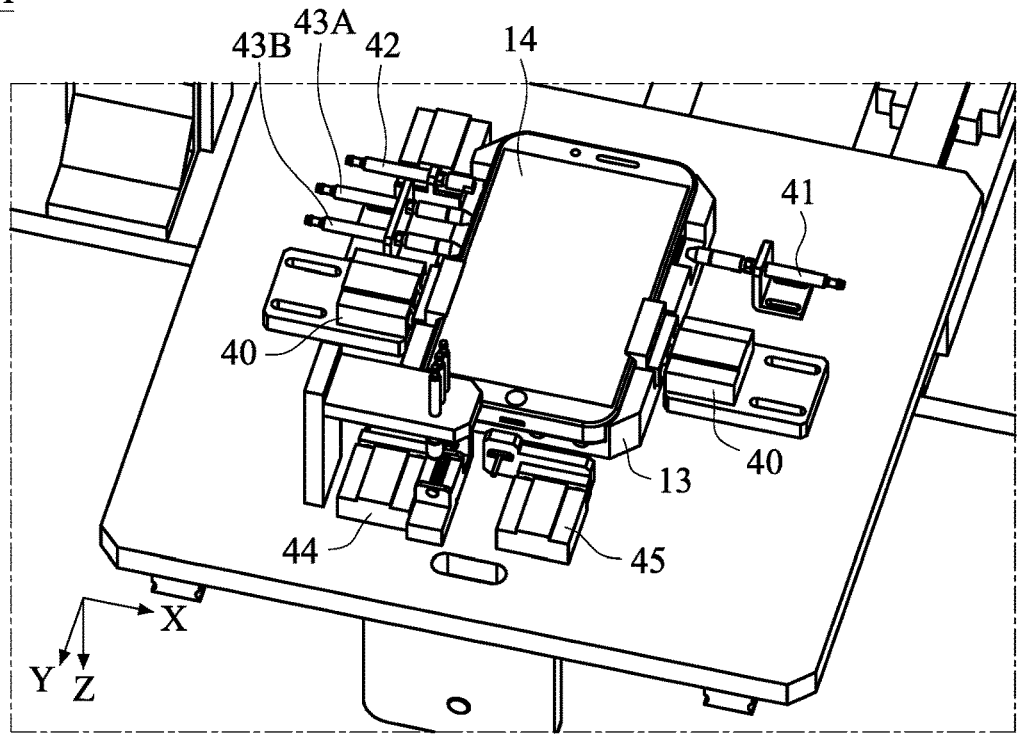
FIG. 4A shows a partial enlarged perspective view of the automatic testing system according to the embodiment of the present disclosure.

FIG. 4A shows a partial enlarged perspective view of the automatic testing system 100 according to the embodiment of the present disclosure. In the embodiment, the automatic testing system 100 may include at least two fixing cylinders 40 respectively disposed on opposite sides of the carrier 13. Actuated fixing cylinders 40 may produce force on lateral surfaces 140A of the DUT 14 to fixedly clamp the DUT 14.

Figure 4B:
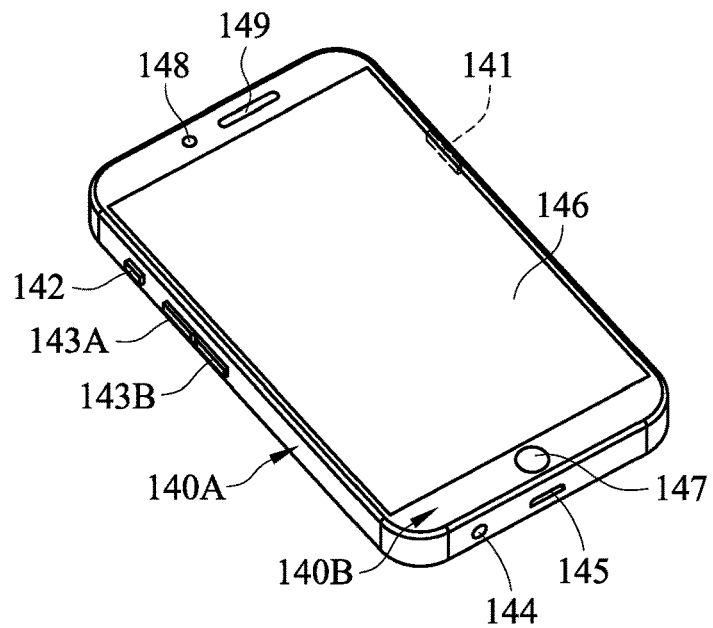
FIG. 4B shows a perspective view of the device under test.

The automatic testing system 100 may include a function test module (100A and 100B) for testing functions of the DUT 14. According to one aspect of the embodiment, the automatic testing system 100 may include a lateral function test module 100A disposed around a periphery of the carrier 13 for testing lateral functions of the DUT 14. In the specification, a function may be referred to a predetermined (or specific) process, action or task that the DUT 14 is able to perform. In one embodiment, the lateral functions may correspond to at least one key and at least one input-output socket. FIG. 4B shows a perspective view of the DUT 14. A power key 141, a mute switch 142, volume keys (including a volume turn-up key 143A and a volume turn-down key 143B), an audio cable socket 144 and a transfer cable socket 145 may be disposed on the lateral surface 140A.

Figure 4C:
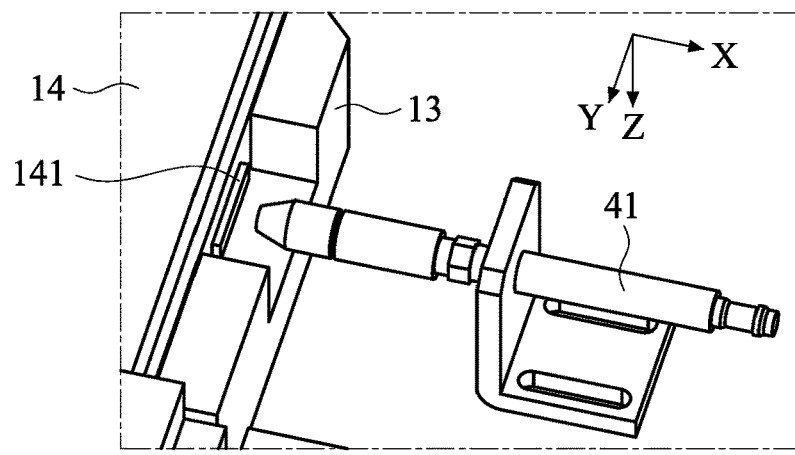
FIG. 4C to FIG. 4E show partial enlarged perspective views of the lateral function test module according to the embodiment of the present disclosure.

In the embodiment, the lateral function test module 100A may include a power key cylinder 41 correspondingly disposed near and configured to activate the power key 141 of the DUT 14 as shown in a partial enlarged perspective view of FIG. 4C. The lateral function test module 100A may include a mute switch cylinder 42 correspondingly disposed near and configured to activate the mute switch 142 of the DUT 14 as shown in a partial enlarged perspective view of FIG. 4D. In the embodiment, the mute switch cylinder 42 may include a first mute switch cylinder 42A, a second mute switch cylinder 42B and a clamp 42C. When the clamp 42C clamping the first mute switch cylinder 42A approaches the mute switch 142 along X-axis, the second mute switch cylinder 42B moves the first mute switch cylinder 42A (along Z-axis) in a direction perpendicular to the rod 33 of the first mute switch cylinder 42A, thereby pulling the mute switch 142.

Figure 4D:
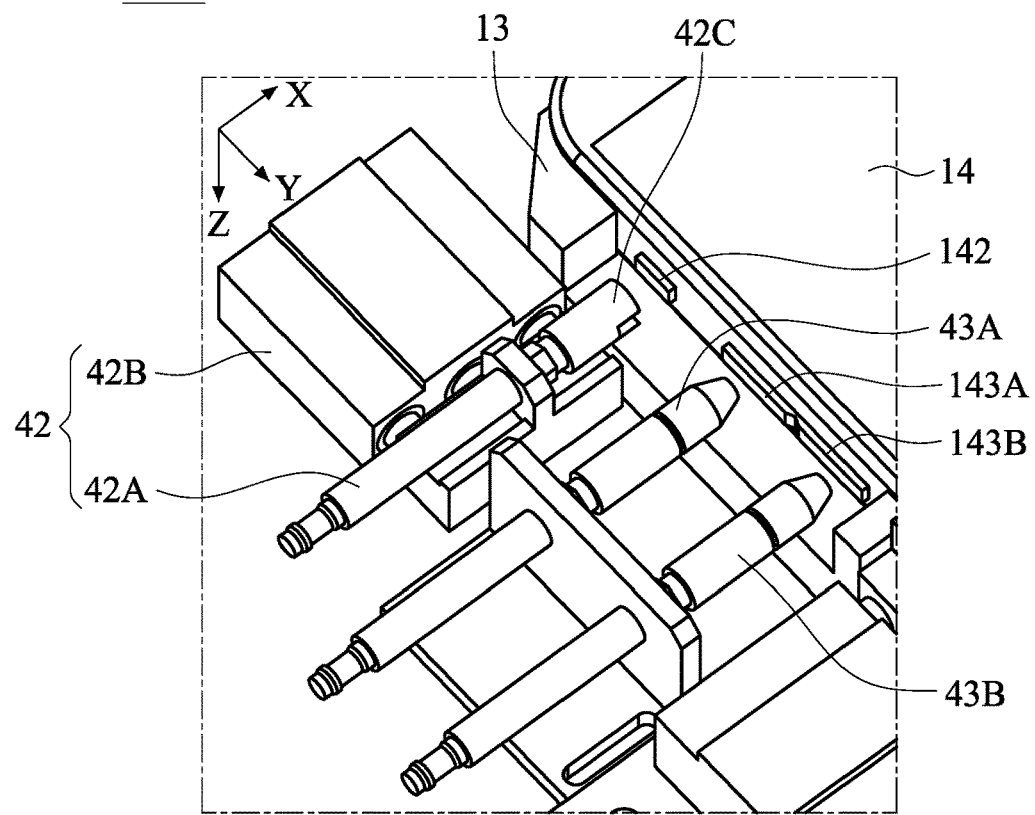

The lateral function test module 100A may include volume key cylinders (including a volume turn-up key cylinder 43A and a volume turn-down key cylinder 43B) correspondingly disposed near and configured to activate the volume keys (i.e., the volume turn-up key 143A and the volume turn-down key 143B) of the DUT 14 respectively as shown in the partial enlarged perspective view of FIG. 4D. The rod 33 of the power key cylinder 41, the mute switch cylinder 42, the volume turn-up key cylinder 43A or the volume turn-down key cylinder 43B may have a front end made of a soft material (such as plastics) for preventing indentations or scratches on the lateral surface 140A of the DUT 14 during a test period.

Figure 4E:
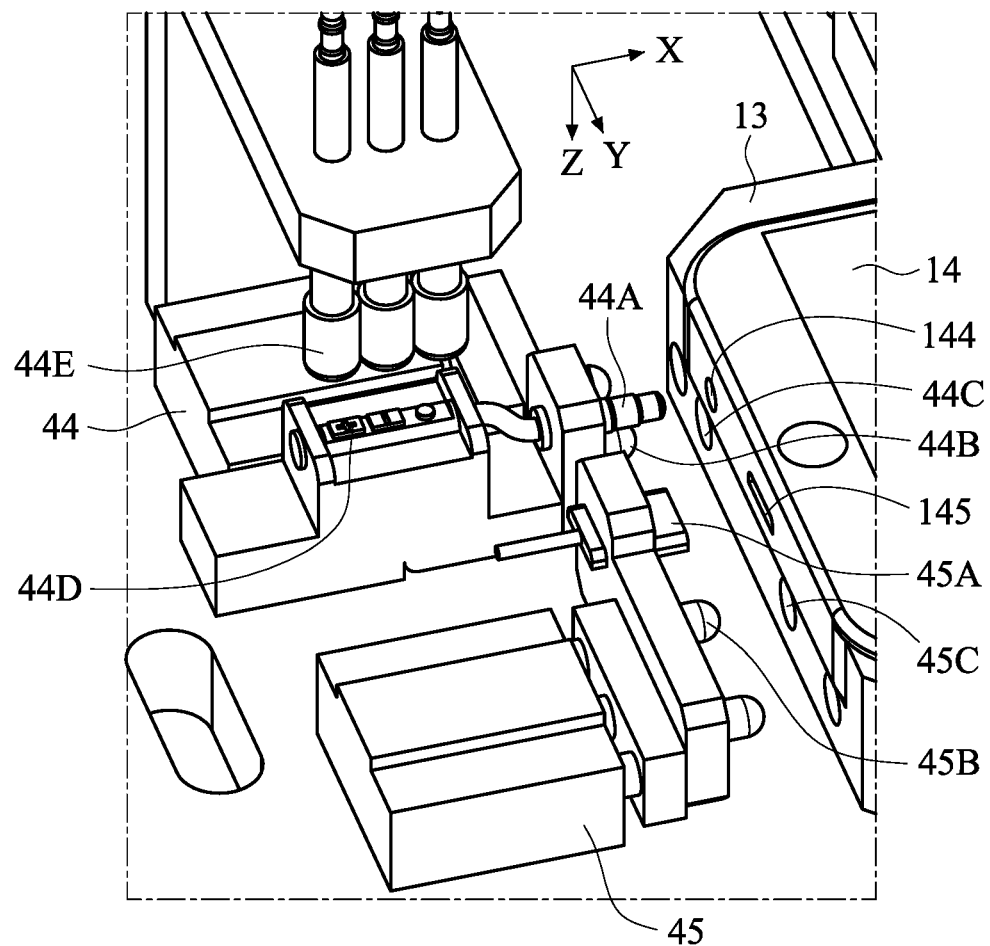

The lateral function test module 100A may include an audio cable cylinder 44 correspondingly disposed near and configured to plug an audio cable connector 44A into the audio cable socket 144 as shown in a partial enlarged perspective view of FIG. 4E. In one embodiment, a guide post 44B may be further provided and a guide hole 44C may be correspondingly set in the carrier 13. The guide post 44B and the guide hole 44C may improve accuracy of alignment while plugging the audio cable connector 44A into the audio cable socket 144. Moreover, audio cable button cylinders 44E may be further provided and configured to activate corresponding audio cable buttons 44D respectively.

The lateral function test module 100A may include a transfer cable cylinder 45 correspondingly disposed near and configured to plug a transfer cable connector 45A into the transfer cable socket 145. In one embodiment, a guide post 45B may be further provided and a guide hole 45C may be correspondingly set in the carrier 13. The guide post 45B and the guide hole 45C may improve accuracy of alignment while plugging the transfer cable connector 45A into the transfer cable socket 145.

According to another aspect of the embodiment, as shown in FIG. 1B, the automatic testing system 100 may include a surface function test module 100B disposed above the platform 12 (or the carrier 13) for testing surface functions on a top surface 140B or a bottom surface (not shown) of the DUT 14. In one embodiment, the surface functions may correspond to a screen, at least tone key, at least one lens and at least one sensor. As shown in the perspective view of the DUT 14 of FIG. 4B, a touch screen 146, a home key 147, a front lens 148 and sensors 149 (such as proximity sensor and light sensor) may be disposed on the top surface 140B.

According to a further aspect of the embodiment, as shown in FIG. 1B, the automatic testing system 100 may include a shifting module 100C for shifting the function test module (100A and 100B). In one embodiment, the shifting module 100C may shift the surface function test module 100B to a location in a three-dimensional space above the platform 12 for performing function detection. In the embodiment, the shifting module 100C may include an X-axis rail 101, a Y-axis rail 102 and a Z-axis rail 103. In one embodiment, an X-axis cylinder 101A corresponding to the X-axis rail 101, a Y-axis step motor 102A corresponding to the Y-axis rail 102, and a Z-axis cylinder 103A corresponding to the Z-axis rail 103 may be provided to shift the surface function test module 100B along X-axis, Y-axis and Z-axis via the X-axis rail 101, the Y-axis rail 102 and the Z-axis rail 103 respectively, such that the surface function test module 100B may be shifted to a proper location above the platform 12 for performing function detection.

Figure 5A:
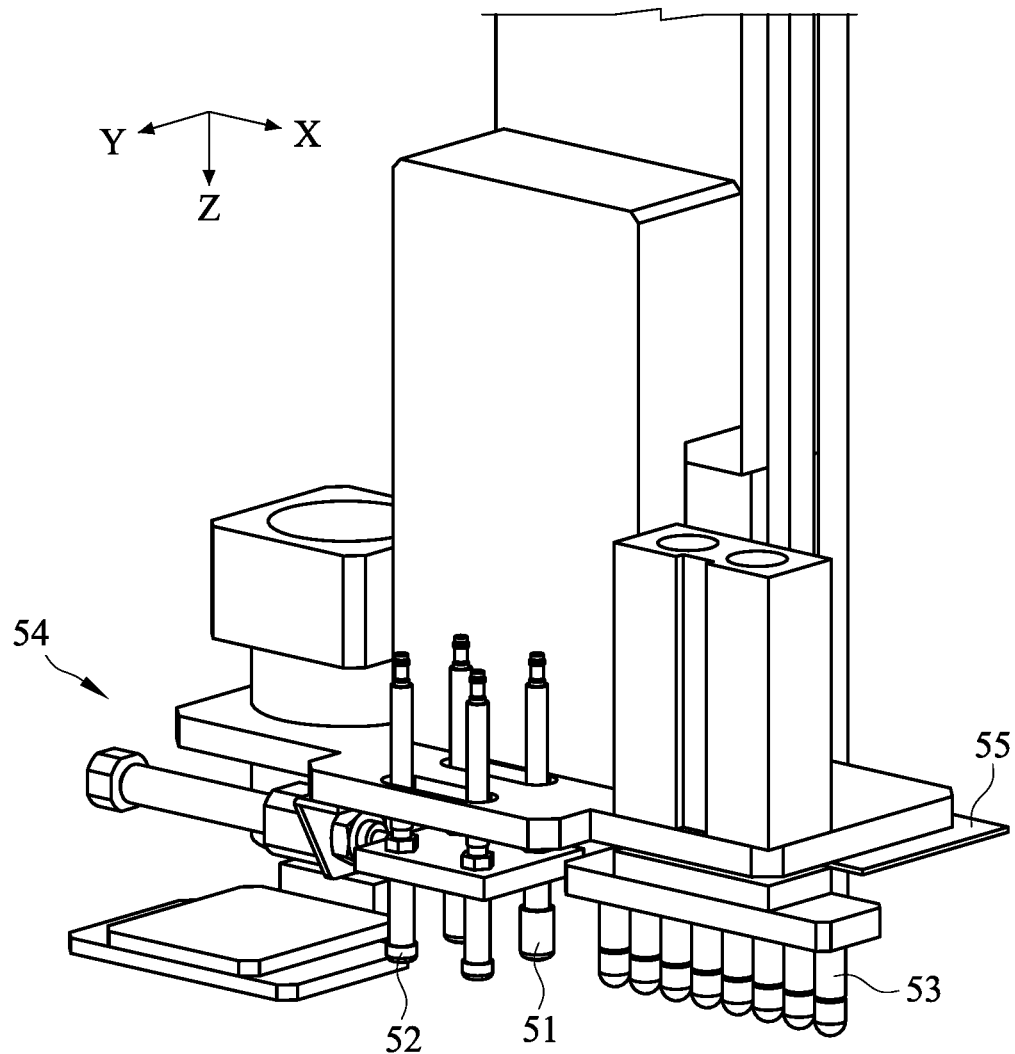
FIG. 5A shows a partial enlarged perspective view of the surface function test module according to the embodiment of the present disclosure.

FIG. 5A shows a partial enlarged perspective view of the surface function test module 100B according to the embodiment of the present disclosure. In the embodiment, the surface function test module 100B may include a screen pressure cylinder 51 shifted to a location above the touch screen 146 of the DUT 14 by the shifting module 100C, and configured to press the touch screen 146. The surface function test module 100B may include a home key cylinder 52 shifted to a location above the home key 147 of the DUT 14 by the shifting module 100C, and configured to activate the home key 147. The surface function test module 100B may include touch screen cylinders 53 shifted to a location above the touch screen 146 of the DUT 14 by the shifting module 100C, configured to touch the touch screen 146, and shifted along X-axis or Y-axis via the X-axis rail 101 or Y-axis rail 102. The rod 33 of the screen pressure cylinder 51, the home key cylinder 52 or the touch screen cylinders 53 may have a front end made of a soft material (such as plastics) for preventing indentations or scratches on the top surface 140B of the DUT 14.

Figure 5B:
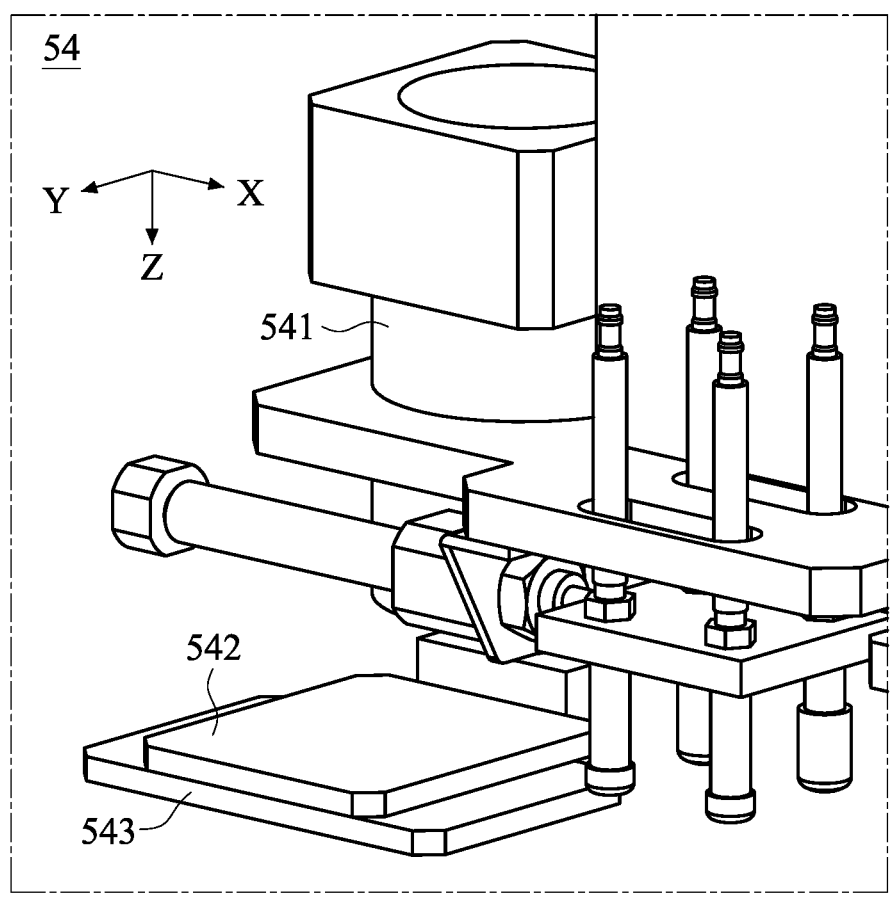
FIG. 5B shows a partial enlarged perspective view of the light test module of FIG. 5A.

In the embodiment, the surface function test module 100B may include a light test module 54 configured to perform light source test or light shield test on the sensor 149 (e.g., light sensor) of the DUT 14. FIG. 5B shows a partial enlarged perspective view of the light test module 54 of FIG. 5A. In the embodiment, the light test module 54 may include a rotary cylinder 541, a fixing member 542 and a light source 543. Specifically, the fixing member 542 is connected to the rotary cylinder 541, and the light source 543 (e.g., light-emitting diode) is fixed to the fixing member 542. Actuated rotary cylinder 541 may rotate to ascend or descend the fixing member 542 and the light source 543 above the sensor 149 of the DUT 14. Light source test may be performed when the light source 543 is turned on, and light shield test may be performed when the light source 543 is turned off.

Referring to FIG. 5A, the surface function test module 100B of the embodiment may include a scan device 55 having a predetermined pattern (e.g., two-dimensional bar code). The scan device 55 may be shifted to a location above the front lens 148 or below a rear lens (not shown) of DUT 14 by the shifting module 100C for performing image capture function of the DUT 14.

The varieties of functions of the automatic testing system 100 of the embodiment may be independently tested and processed not in a sequence. Some functions may be tested in combination according to specific test requirements. For example, the power key 141 and the home key 147 may be tested in combination.

Figure 6:
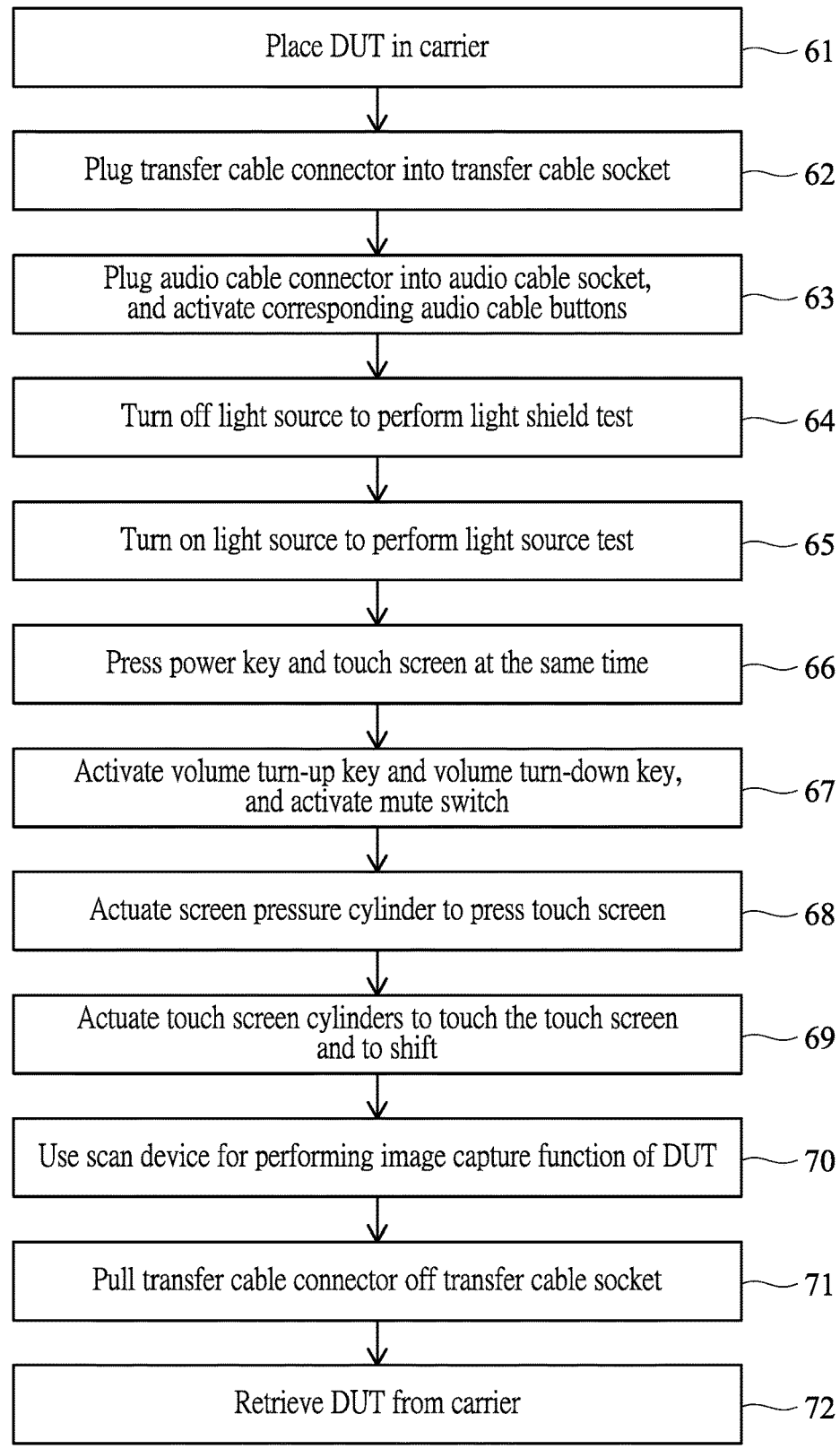
FIG. 6 shows a flow diagram illustrating an automatic testing method according to the embodiment of the present disclosure.

FIG. 6 shows a flow diagram illustrating an automatic testing method 600 according to the embodiment of the present disclosure. At first, in step 61, the stretching cylinder 15 may push the platform 12 outside the casing 11 for placing the DUT 14 in the carrier 13 by a test person. Afterward, the stretching cylinder 15 may pull the platform 12 inside the casing 11 ready for performing test. Subsequently, in step 62, the transfer cable cylinder 45 may be actuated to plug a transfer cable connector 45A into the transfer cable socket 145. In step 63, the audio cable cylinder 44 may be actuated to plug an audio cable connector 44A into the audio cable socket 144, and the audio cable button cylinders 44E may be actuated to activate corresponding audio cable buttons 44D respectively. In step 64, the rotary cylinder 541 may be actuated to rotate the fixing member 542 and the light source 543 above the sensor 149 of the DUT 14, and the light source 543 may be turned off to perform light shield test. In step 65, the light source 543 may be turned on to perform light source test. In step 66, the power key cylinder 41 may be actuated to activate the power key 141, and, at the same time, the screen pressure cylinder 51 may be actuated to press the touch screen 146. In step 67, the volume turn-up key cylinder 43A and a volume turn-down key cylinder 43B may be actuated to activate the volume turn-up key 143A and the volume turn-down key 143B, respectively. Afterwards, the mute switch cylinder 42 may be actuated to activate the mute switch 142. In step 68, the screen pressure cylinder 51 may be shifted to a location above the touch screen 146 of the DUT 14 by the shifting module 100C to press the touch screen 146. In step 69, the touch screen cylinders 53 may be shifted to a location above the touch screen 146 of the DUT 14 by the shifting module 100C to touch the touch screen 146, and be shifted along X-axis or Y-axis via the X-axis rail 101 or Y-axis rail 102. In step 70, the scan device 55 may be shifted to a location above the front lens 148 or below a rear lens of DUT 14 by the shifting module 100C for performing image capture function of the DUT 14. In step 71, the transfer cable cylinder 45 may be actuated to pull a transfer cable connector 45A off the transfer cable socket 145. Finally, in step 72, the stretching cylinder 15 may push the platform 12 outside the casing 11 for retrieving the DUT 14 from the carrier 13 by the test person.

Although specific embodiments have been illustrated and described, it will be appreciated by those skilled in the art that various modifications may be made without departing from the scope of the present disclosure, which is intended to be limited solely by the appended claims.

What is claimed is:
1. An automatic testing system, comprising:
   a platform;
   a carrier fixed on a surface of the platform for carrying a device under test (DUT);
   at least two fixing driving devices respectively disposed on opposite sides of the carrier, the fixing driving devices being actuated to produce force on lateral surfaces of the DUT to fixedly clamp the DUT;
   a function test module for testing a plurality of functions of the DUT; and
   a shifting module for shifting the function test module.
2. The system of claim 1, further comprising:
   a casing that accommodates the platform, the carrier, the function test module and the shifting module.
3. The system of claim 2, further comprising:
   a stretching driving device connected to the platform to push the platform outside the casing or to pull the platform inside the casing.
4. The system of claim 1, wherein the shifting module comprises:
   an X-axis rail;
   a Y-axis rail;
   a Z-axis rail;
   an X-axis driving device that shifts the function test module along X-axis via the X-axis rail;
   a Y-axis driving device that shifts the function test module along Y-axis via the Y-axis rail; and
   a Z-axis driving device that shifts the function test module along Z-axis via the Z-axis rail.
5. The system of claim 1, wherein the function test module comprises:
   a lateral function test module disposed around a periphery of the carrier for testing a plurality of lateral functions of the DUT; and
   a surface function test module disposed above the platform for testing a plurality of surface functions of the DUT.
6. The system of claim 5, wherein the lateral function corresponds to a key, a switch or an input-output socket, and the lateral function test module comprises at least one driving device that is actuated to activate the key, the switch or to plug a connector to the input-output socket;
   wherein the key comprises a power key, and the lateral function test module comprises a power key driving device correspondingly disposed near and configured to activate the power key.
7. The system of claim 6, wherein the key comprises a mute switch, and the lateral function test module comprises a mute switch driving device correspondingly disposed near and configured to activate the mute switch.
8. The system of claim 7, wherein the mute switch driving device comprises:
   a first mute switch driving device with a clamp; and
   a second mute switch driving device that moves the first mute switch driving device and the clamp upward or downward to pull the mute switch.

9. The system of claim 6, wherein the key comprises at least one volume key, and the lateral function test module comprises at least one volume key driving device correspondingly disposed near and configured to activate the volume key.

10. The system of claim 6, wherein the input-output socket comprises an audio cable socket, and the lateral function test module comprises an audio cable driving device correspondingly disposed near and configured to plug an audio cable connector into the audio cable socket.

11. The system of claim 6, wherein the input-output socket comprises a transfer cable socket, and the lateral function test module comprises a transfer cable driving device disposed near and configured to plug a transfer cable connector into the transfer cable socket.

12. The system of claim 5, wherein the surface function corresponds to a screen, a key, a sensor or a lens, and the surface function test module comprises at least one driving device that is shifted to a location above or below the DUT by the shifting module and is actuated to perform test;
wherein the screen comprises a touch screen, and the surface function test module comprises a screen pressure driving device shifted to a location above the touch screen by the shifting module and actuated to press the touch screen.

13. The system of claim 12, wherein the key comprises a home key, and the surface function test module comprises a home key driving device shifted to a location above the home key by the shifting module and actuated to activate the home key.

14. The system of claim 12, wherein the sensor comprises a light sensor, and the surface function test module comprises a light test module shifted to a location above the light sensor by the shifting module to perform light source test or light shield test on the light sensor.

15. The system of claim 14, wherein the light test module comprises:
a rotary driving device;
a fixing member connected to the rotary driving device; and
a light source fixed to the fixing member;
wherein the rotary driving device is actuated to move the light source to a location above the light sensor, and the light source is turned on to perform the light source test or is turned off to perform the light shield test.

16. The system of claim 12, wherein the surface function test module comprises a scan device having a predetermined pattern, the scan device being shifted to a location above or below the lens by the shifting module for performing image capture function of the DUT.

17. An automatic testing method, comprising:
providing a platform with a carrier fixed thereon, and providing a casing to accommodate the platform and the carrier;
pushing the platform outside the casing for placing a device under test (DUT) in the carrier, at least two fixing driving devices respectively disposed on opposite sides of the carrier, the fixing driving devices being actuated to produce force on lateral surfaces of the DUT to fixedly clamp the DUT;
pulling the platform inside the casing for testing a plurality of functions of the DUT; and
pushing the platform outside the casing for retrieving the DUT from the carrier after completing testing.

18. The method of claim 17, wherein the functions of the DUT comprise:
a plurality of lateral functions of the DUT, the lateral function corresponding to a key, a switch or an input-output socket, wherein the key comprises a power key or at least one volume key, the switch comprises a mute switch, and the input-output socket comprises an audio cable socket or a transfer cable socket; and
a plurality of surface functions of the DUT, the surface function corresponding to a screen, a key, a sensor or a lens, wherein the sensor comprises a light sensor, and light source test is performed on the light sensor when a light source is turned on, and light shield test is performed on the light.

19. An automatic testing system, comprising:
a platform;
a carrier fixed on a surface of the platform;
at least two fixing driving devices respectively disposed on opposite sides of the carrier, the fixing driving devices being actuated to produce force toward the carrier;
a function test module for performing test functions; and
a shifting module for shifting the function test module.

* * * * *